(12) United States Patent
Phillipps et al.

(10) Patent No.: US 7,879,514 B2
(45) Date of Patent: Feb. 1, 2011

(54) LITHOGRAPHIC METHOD AND PATTERNING DEVICE

(75) Inventors: Geoffrey Norman Phillipps, Luyksgestel (NL); Cheng-Qun Gui, Best (NL); Rudy Jan Maria Pellens, Overpelt (BE); Paulus Wilhelmus Leonardus Van Dijk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 1015 days.

(21) Appl. No.: 11/498,980

(22) Filed: Aug. 4, 2006

(65) Prior Publication Data

US 2008/0032203 A1 Feb. 7, 2008

(51) Int. Cl.
*G03F 9/00* (2006.01)
*G03C 5/00* (2006.01)
*G03F 1/00* (2006.01)

(52) U.S. Cl. .................... 430/22; 430/30; 430/5
(58) Field of Classification Search ............ 430/5, 430/22, 30; 355/52, 53; 356/401
See application file for complete search history.

(56) References Cited

U.S. PATENT DOCUMENTS

| 5,250,983 A * | 10/1993 | Yamamura .................. 355/125 |
| 5,298,761 A | 3/1994 | Aoki et al. .................. 250/548 |
| 6,104,471 A * | 8/2000 | Morioka et al. ............... 355/53 |
| 6,163,366 A | 12/2000 | Okamoto et al. .............. 355/53 |
| 7,019,814 B2 | 3/2006 | Best et al. .................... 355/53 |

| 2003/0127666 A1 * | 7/2003 | Lee ............................ 257/225 |
| 2003/0213921 A1 | 11/2003 | Van De Moosdijk et al. ................... 250/492.1 |
| 2004/0156027 A1 * | 8/2004 | Best et al. ..................... 355/53 |

FOREIGN PATENT DOCUMENTS

| JP | 08-069958 A | 3/1996 |
| JP | 63-047926 A | 2/1998 |
| JP | 2000-174361 A | 6/2000 |
| JP | 2000-199973 A | 7/2000 |
| JP | 2001-166496 A | 6/2001 |

OTHER PUBLICATIONS

English Translation of Notice of Reasons for Rejection, issued by Japanese Patent Office on Aug. 26, 2010 in related Japanese Application No. 2007-195647.

* cited by examiner

*Primary Examiner*—Mark F Huff
*Assistant Examiner*—Stewart A Fraser
(74) *Attorney, Agent, or Firm*—Pillsbury Winthrop Shaw Pittman LLP

(57) ABSTRACT

A lithographic method includes patterning a beam of radiation with a patterning device. The patterning device includes at least two image patterning portions and at least two metrology mark patterning portions. The method also includes projecting at least two image portions of the patterned beam of radiation sequentially onto target portions of a substrate such that the projected image portions are substantially adjacent to each other on the substrate and collectively form a composite image on the substrate. The method also includes projecting a metrology mark onto the substrate outside of the area of the composite image at the same time as projecting each of at least two of the image portions, and measuring the alignment of the metrology marks to determine the relative positions of the at least two image portions.

15 Claims, 7 Drawing Sheets

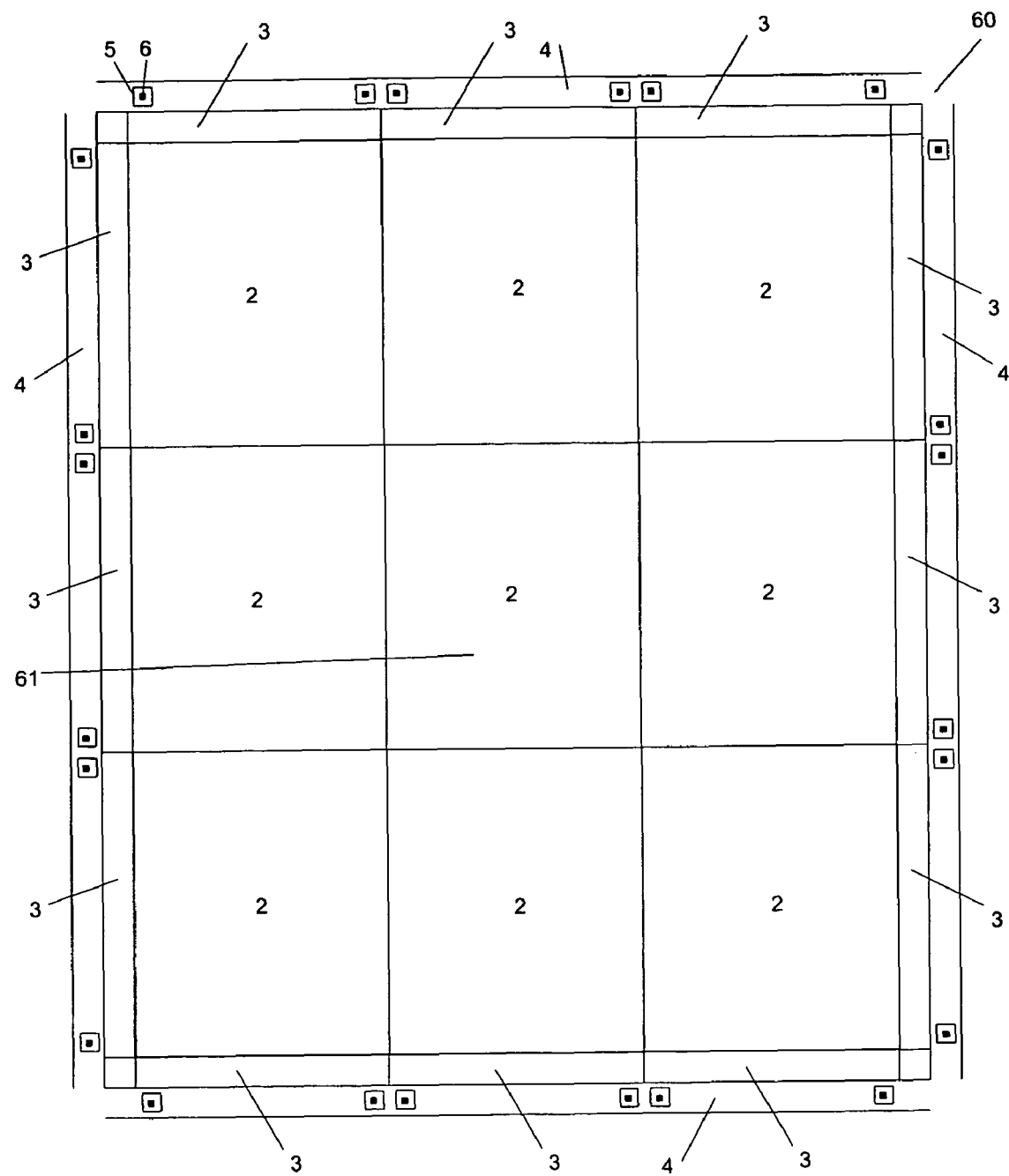

LITHOGRAPHIC METHOD AND PATTERNING DEVICE

FIELD

The present invention relates, inter alia, to a lithographic method and a patterning device.

BACKGROUND

A lithographic apparatus is a machine that applies a desired pattern onto a target portion of a substrate. A lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

For certain applications, the area of substrate that is to be imaged for a single layer of a device may exceed the maximum cross sectional area of a projection beam of a lithographic apparatus. Such applications include large image sensors, such as charge-coupled devices (CCDs), large photonic devices, and thin film heads. A composite image can be formed from image portions projected onto target portions of the substrate that are smaller than the maximum cross sectional area of the projection beam. The image portions are separately provided by or to the patterning device and projected sequentially onto the surface of the substrate. For such applications, image portions projected onto adjacent target portions of the substrate must be closely aligned. For some applications, accurate alignment of adjacent image portions projected onto adjacent target portions of a substrate may be essential in order for the finished device to work. If two adjacent image portions are not correctly aligned within a predetermined tolerance band, it may only be detectable after the device has been completed and is subjected to electrical testing.

It is an aim of the present invention to obviate or mitigate one or more of the problems of the prior art, whether identified herein or elsewhere.

SUMMARY

According to an aspect of the invention, there is provided a lithographic method. The method includes patterning a beam of radiation with a patterning device. The patterning device includes at least two image patterning portions and at least two metrology mark patterning portions. The method also includes projecting at least two image portions of the patterned beam of radiation sequentially onto target portions of the substrate such that the projected image portions are substantially adjacent to each other on the substrate and collectively form a composite image on the substrate. The method further includes projecting a metrology mark onto the substrate outside of the area of the composite image at the same time as projecting each of at least two of the image portions, and measuring the alignment of the metrology marks to determine the relative positions of the at least two image portions.

According to a further aspect of the invention, there is provided a device manufactured according to the method described above.

According to a further aspect of the invention, there is provided an image sensor manufactured according to the method described above.

According to a further aspect of the invention, there is provided a lithographic apparatus that includes an illumination system for providing a projection beam of radiation, and a support structure for supporting a patterning device. The patterning device serves to impart the projection beam with a pattern in its cross-section. The apparatus also includes a substrate table for holding a substrate, and a projection system for projecting the patterned beam onto a target portion of the substrate. The lithographic apparatus is adapted to sequentially project at least two image portions onto target portions of the substrate. The projected image portions are arranged to be substantially adjacent to each other on the substrate and collectively form a composite image on the substrate. The apparatus is further adapted to project a metrology mark onto the substrate outside of the area of the composite image at the same time as projecting each of at least two of the image portions. The metrology marks being adapted such that their relative alignment can be measured to determine the relative positions of the at least two image portions.

According to a further aspect of the invention, there is provided a lithographic method. The method includes patterning a beam of radiation with a patterning device, and projecting a plurality of image portions sequentially onto target portions of a substrate such that the projected image portions are substantially adjacent to each other on the substrate and collectively form a composite image on the substrate. The composite image includes at least one image portion completely surrounded by other image portions. The method also includes determining the relative positions of at least two of the image portions, other than the image portion completely surrounded by other image portions, and determining the probable position of the at least one image portion completely surrounded by other image portions, relative to at least one other image portion, from the determined relative positions.

According to a further aspect of the invention, there is provided a lithographic apparatus that includes an illumination system for providing a projection beam of radiation, and a support structure for supporting a patterning device. The patterning device serves to impart the projection beam with a pattern in its cross-section. The apparatus also includes a substrate table for holding a substrate, and a projection system for projecting the patterned beam onto a target portion of the substrate. The lithographic apparatus is adapted to sequentially project a plurality of image portions onto target portions of the substrate. The projected image portions are arranged to be substantially adjacent to each other on the substrate and collectively form a composite image on the substrate. The composite image includes at least one image portion completely surrounded by other image portions. The lithographic apparatus is further adapted to determine the relative positions of at least two of the image portions, other than the image portion completely surrounded by other image portions, and from the determined relative positions to determine the probable position of the at least one image portion completely surrounded by other image portions, relative to at least one other image portion.

According to a further aspect of the invention, there is provided a patterning device for a lithographic apparatus. The patterning device includes at least two image patterning regions, and at least two metrology mark patterning regions, each metrology mark patterning region being in a fixed spatial relationship with a respective one of the image portion patterning regions. The image patterning regions are separated from one another.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 depicts a composite image in accordance with an alternative embodiment of the present invention.

DETAILED DESCRIPTION

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section so as to create a pattern in a target portion of the substrate. It should be noted that the pattern imparted to the projection beam might not exactly correspond to the desired pattern in the target portion of the substrate. Generally, the pattern imparted to the projection beam will correspond to a particular functional layer in a device being created in the target portion, such as an integrated circuit. The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

Figure 1:
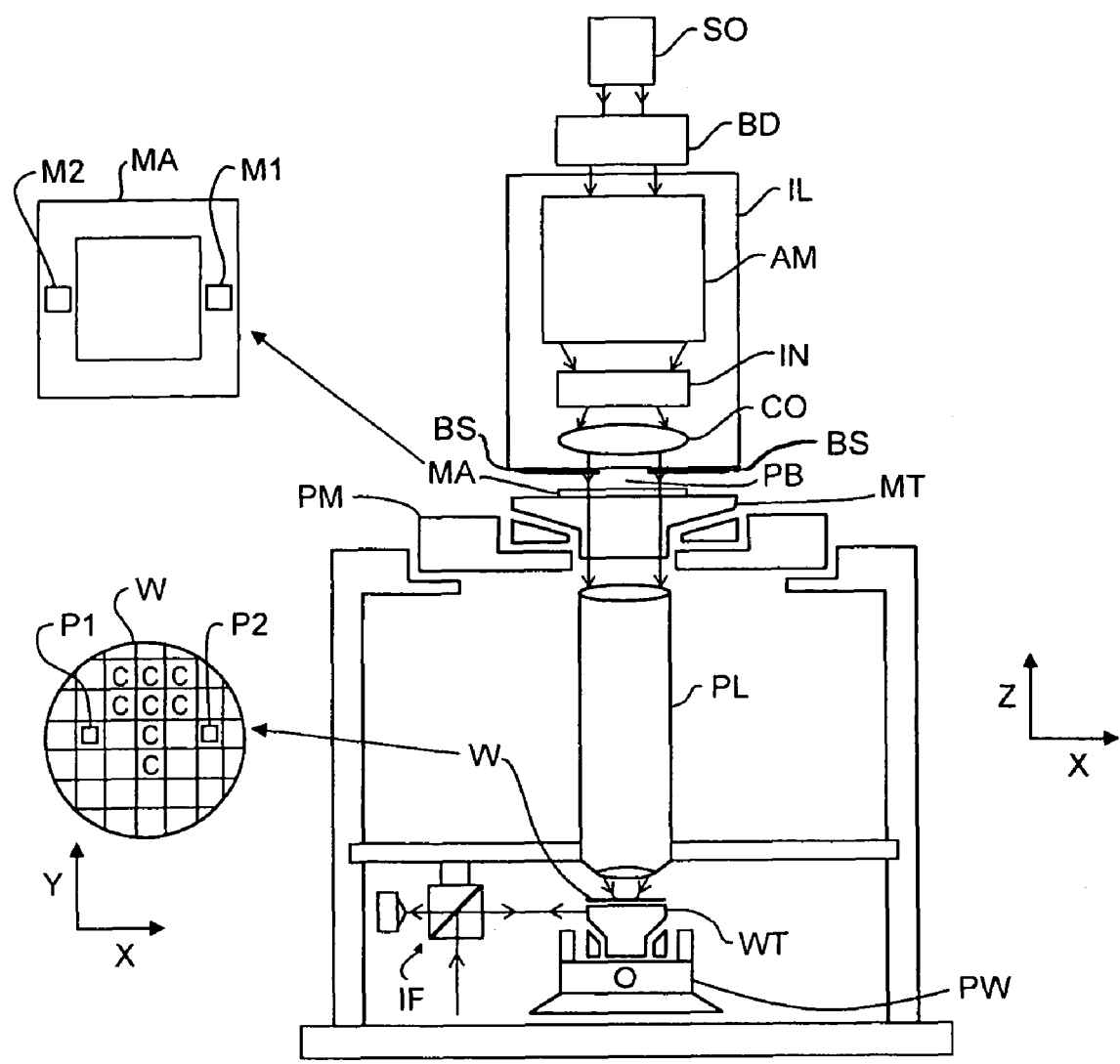
FIG. 1 depicts a lithographic apparatus according to an embodiment of the invention.

FIG. 1 schematically depicts a lithographic apparatus. The apparatus comprises: an illumination system (illuminator) IL for providing a projection beam PB of radiation (e.g. UV radiation); a first support structure (e.g. a mask table) MT for supporting a patterning device (e.g. a mask) MA and connected to first positioner PM for accurately positioning the patterning device with respect to item PL; a substrate table (e.g. a wafer table) WT for holding a substrate (e.g. a resist-coated wafer) W and connected to second positioner PW for accurately positioning the substrate with respect to item PL; and a projection system (e.g. a refractive projection lens) PL for imaging a pattern imparted to the projection beam PB by the patterning device MA onto a target portion C (e.g. comprising part of a die or one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be integral part of the apparatus, for example when the source is a mercury lamp. The source SO and the illuminator IL, together with the beam delivery system BD, if needed, may be referred to as a radiation system.

The illuminator IL may comprise adjustor AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator L generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

If, for a given application, the area of substrate that is required to be imaged for a single layer of a device exceeds the maximum cross sectional area of the projection beam of the lithographic apparatus, then a composite image can be built up from image portions separately projected onto adjacent target portions of the substrate. This process is referred to herein as "stitching". Such applications include large image sensors such as CCDs, large photonic devices and thin film heads. For such applications, it is generally relevant that image portions projected onto adjacent target portions of the substrate are closely aligned. For some applications, accurate alignment of adjacent image portions projected onto adjacent target portions of a substrate is essential for the finished device to work. For some applications such as the fabrication of large image sensors, the whole of the area of the composite image may comprise active areas. Consequently, if the image portions are arranged to be directly adjacent to one another in the composite image, space within the composite image (and thus within any of the image portions) to include metrology marks for checking the alignment of the image portions is limited or not available. Thus, a drawback of conventional stitching processes is that the alignment of the image portions may not be measured. If two adjacent image portions are not correctly aligned, this may only be detectable after the device has been completed and is subjected to electrical testing. For such applications, the device may only be completed after a large number of layers (for instance 30) have been imaged and processed. If it is only after completion that the device can be tested, then a considerable amount of time and money may be wasted for devices that ultimately fail electrical testing. Certain of the layers of a device may require a greater level of accuracy when aligning separate image portions. For instance, projected layers that are used to pattern a device for applying metal layers, implantation layers, and polysilicon layers may need a greater level of stitching accuracy than other layers.

In accordance with embodiments of the present invention, large devices comprising a composite image are formed from sequentially projected image portions. At the same time as the image portions are projected onto target portions of the substrate, additional metrology marks are projected onto the substrate outside of the area of the composite image, for example, in scribe lanes adjacent to or surrounding the composite image area. The scribe lanes are portions of the substrate that are often used to separate each device from its neighbors. Once a substrate has been fully processed, the substrate may be cut along the scribe lanes, thereby separating individual devices. Therefore, the area of the scribe lanes is available for use for projecting metrology marks during processing of the substrate, as the area of the scribe lanes represents otherwise wasted substrate.

The metrology marks projected onto a substrate outside of the composite image allow the alignment (or stitching performance) of the image portions to be measured. This is desirable as it allows alignment errors to be detected as soon as a single layer of a device has been imaged onto the substrate, rather than waiting for electrical testing once the device has been completed. The alignment may be measured in real time as each layer is projected onto the substrate, or during later offline analysis.

A lithographic apparatus in accordance with embodiments of the present invention sequentially projects at least two image portions onto target portions of the substrate. The image portions are arranged to be substantially adjacent to each other on the substrate and collectively form the composite image. The lithographic apparatus is further adapted to project a metrology mark onto the substrate outside of the area of the composite image, for instance in the scribe lanes, at the same time as projecting each of at least two respective image portions. Measurement of the relative positions of the metrology marks allows the alignment accuracy of the image portions to be measured.

As each metrology mark is simultaneously printed with at least one image portion, measurement of the position of that metrology mark provides direct information about the position of that respective image portion. Thus, measuring the relative positions of two metrology marks is directly equivalent to measuring the relative positions of the respective image portions. This direct relationship between the position of a metrology mark and the position of an associated image portion is a result of the fact that both the image portion and each metrology mark are included on the same patterning device, such that both are imparted to the projection beam simultaneously. As long as the metrology marks and the image portions are accurately aligned on each patterning device, then when they are projected on to the substrate this relative alignment is preserved.

Figure 3:
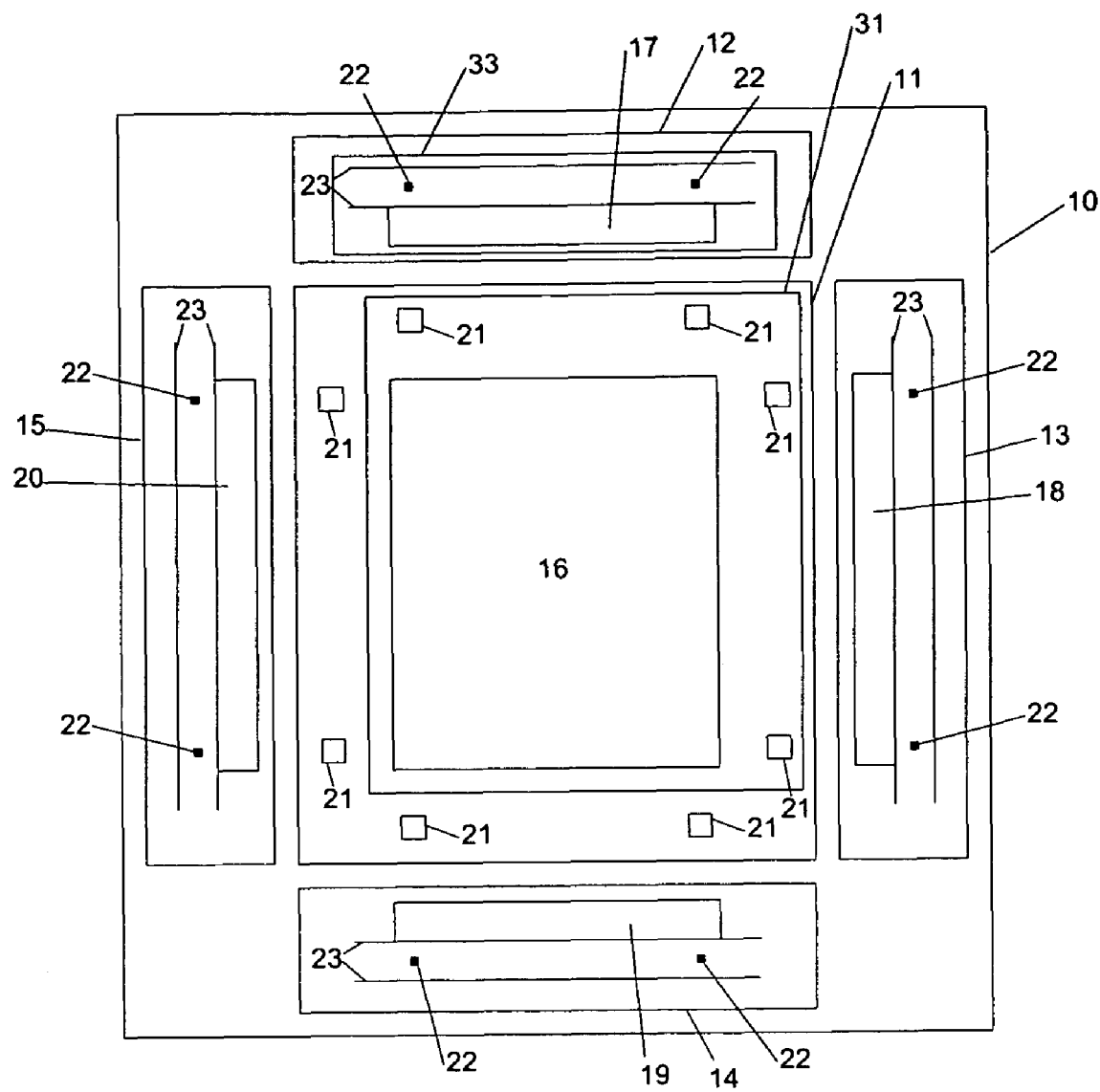
FIG. 3 depicts a patterning device suitable for sequentially projecting image portions of the composite image of FIG. 2 onto a substrate.

In certain embodiments of the present invention, multiple image portions and all of the associated metrology marks are incorporated onto a single patterning device, such as a mask. An example mask is shown in FIG. 3, and is discussed in more detail below. A lithographic apparatus according to certain embodiments of the present invention further comprises a blading system, comprising adjustable panels or blades located in the path of the projection beam PB that are moveable to block off parts of the projection beam associated with image portions or metrology marks not needed to be projected at that time and prevent them from being imaged. The lithographic apparatus including the blading system can thus be flexibly programmed, ensuring that the metrology marks are correctly imaged onto the substrate with each individual exposure as the entire composite image is built up.

Figure 2:
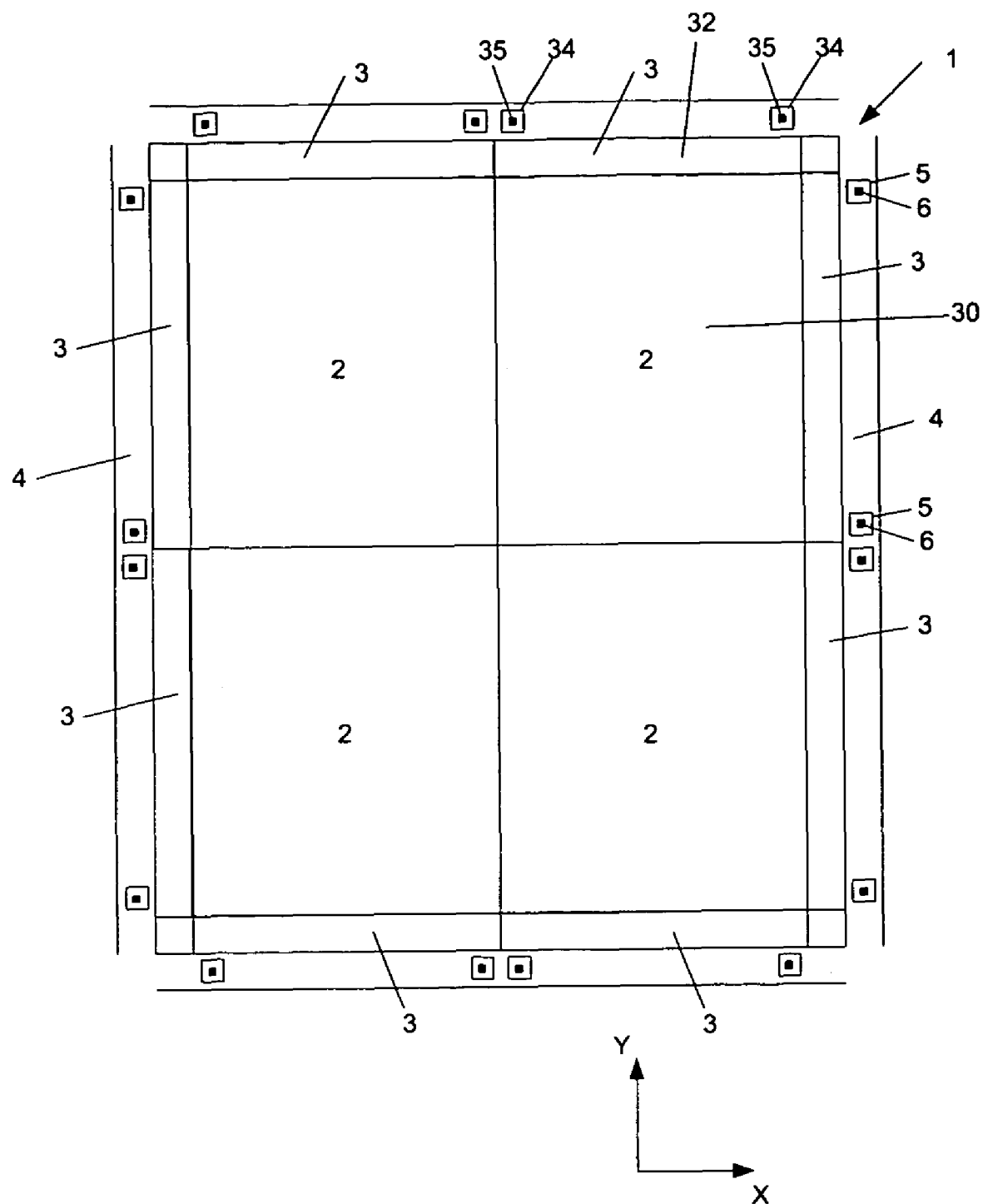
FIG. 2 depicts a composite image comprising a plurality of image portions and associated marks projected onto a substrate in accordance with an embodiment of the present invention.

An example application of the present invention relates to a large image sensor such as a CCD. Referring now to FIG. 2, this illustrates a composite image 1 built up from a number of image portions in accordance with an embodiment of the present invention. The composite image 1 represents a single layer of the image sensor as it appears after all of the image portions have been projected onto the substrate, during an intermediate stage of fabrication of the image sensor. There are two distinct types of image portion: pixel blocks 2 and periphery blocks 3.

Pixel blocks 2 comprise a repeating pattern of active sensors. In an embodiment, each pixel block 2 is the same, and together form a continuous block pattern. FIG. 2 shows an arrangement in which there are four pixel blocks 2 forming the image sensor. It will be appreciated that there may be any suitable number of pixel blocks 2. It will be further appreciated that after the layer shown in FIG. 2 has been processed, there may be a large number of other layers projected on top of that layer shown in FIG. 2 as the remainder of the image sensor is built up.

Periphery blocks 3 typically comprise interconnections for connecting the pixel blocks 2 to external components, such as pins on the outside of a finished package. In an embodiment, the whole of the area of both the pixel blocks 2 and the periphery blocks 3 comprise active areas, making it cumbersome if not practically impossible to put metrology marks within the areas of the image portions in order to measure the alignment of image portions. Also shown in FIG. 2 are the scribe lanes 4, which, as shown, extend right up to the edge of the composite image 1, i.e. up to the edge of the periphery blocks 3.

FIG. 2 further shows the metrology marks. There are two types of metrology marks: large boxes 5 and small boxes 6 (for clarity, not all of the metrology marks 5,6 are labeled in FIG. 2). This is a known form of metrology, referred to herein as box-in-box, in which the large boxes 5 and the small boxes 6 are separately imaged onto the substrate. It can be seen that the metrology marks are projected onto the substrate within the scribe lanes 4.

In embodiments of the present invention each large box 5 is projected onto the substrate at the same time as the pixel block 2 closest to the desired location of that large box 5. Each small box is projected onto the substrate at the same time as the periphery block 3 closest to that small box. The patterning device used to impart the image of a pixel block 2 or a periphery block 3 further comprises the appropriate metrology marks 5,6 at the correct distance away from the pixel block 2 or periphery block 3. The image portions are separately projected onto the substrate, such that when an adjacent pixel block 2 and periphery block 3 have been projected onto the substrate the associated metrology marks come together. If the image portions are correctly aligned, a small box 6 appears in the center of a large box 5. The offset, if any, of each small box 6 from the center of its associated large box 5 can be measured. As the image portions (pixel and periphery block) 2,3 are projected at the same time as the metrology marks 5,6, any offset between the metrology marks is a direct measurement of the relative offset between the associated pair of image portions. As long as the offset for each pair of large box/small box metrology marks is within a predefined tolerance band, then the alignment of the image portions will also be within the same tolerance band.

FIG. 2 is an example of an embodiment of the present invention in which the composite image is formed from pixel blocks stitched together along two axes, shown in FIG. 2 as the axes X and Y. However, it will be appreciated that in alternative embodiments of the present invention, the pixel blocks may only be stitched together along a single axis, that is that pixel blocks are along a single line.

Referring now to FIG. 3, this schematically illustrates a patterning device suitable for projecting the composite image 1 illustrated in FIG. 2. The patterning device comprises a mask 10, although it will be appreciated that in other embodiments of the present invention, alternative forms of patterning devices may be used.

Mask 10 comprises five separate regions 11-15, each region being separated from adjacent regions. Each region comprises a patterning portion for either a pixel block 16 or one of four different periphery blocks 17-20. Patterning portions 16-20 are adapted to impart a pattern to the projection beam such that for each patterning portion either a pixel block or a periphery block is projected onto the surface of the substrate. The periphery blocks are adapted to be projected onto the substrate at the correct position relative to the side of the nearest pixel block. Furthermore, within each region, there are included metrology mark patterning portions. The metrology mark patterning portions comprise either patterning portions 21 for the large box metrology marks, or patterning portions 22 for the small box metrology marks. Patterning portions 21 are contained within region 11 associated with the pixel block patterning portion 16. Patterning portions 22 are contained within regions 12-15 associated with the periphery block patterning portions 17-20. Lines 23 indicate the approximate positions of the edge of the scribe lanes 4 relative to the periphery block patterning portions 17-20, although it will be appreciated that these may not in fact represent features actually projected onto the substrate.

In an embodiment, the lithographic apparatus further comprises a blading system BS (see FIG. 1) that comprises moveable blades located in the path of the projection beam, which can be flexibly programmed to block off the projection beam from selected portions of the mask 10. This allows selection of specific portions of the mask 10 for projection onto the substrate.

The lithographic apparatus is adapted to determine which portions of the mask 10 to block off with the blading system when projecting each image portion onto the substrate. For instance, with reference to FIG. 2, when it is desired to project pixel block 30 located in the upper right quadrant of the composite image 1, then the large box metrology marks 5 to the right and above pixel block 30 may be projected on to the substrate at the same time. The blading system is controlled to block off the whole of mask 10 except that portion contained within box 31. If it is then desired to project periphery block 32, then the blading system would be controlled to mask off the patterned projection beam corresponding to the whole of mask 10 except that portion contained within box 33.

The separation between each region 11-15 of the mask 10 allows straightforward selection of a desired region using the blading system.

It can be seen that the positions of the metrology mark patterning portions and the image portion patterning portions projected at the same time are in a fixed spatial relationship. For instance, when projecting pixel block 30, if the patterning device and the substrate are not correctly aligned, then large box metrology marks 34 will be out of alignment with the small box metrology marks 35 projected onto the substrate when periphery block 32 is projected onto the substrate (which may be before or after pixel block 30 is projected onto the substrate). The relative alignment of metrology marks 34 and 35 may be measured by conventional means.

Referring back to FIG. 2, this illustrates a composite image 1 built up from a number of image portions in which the pixel blocks 2 and the periphery blocks 3 are aligned to a tolerable level of accuracy. Small box metrology marks 6 are all located approximately centrally within the large box metrology marks 5.

Figure 4:
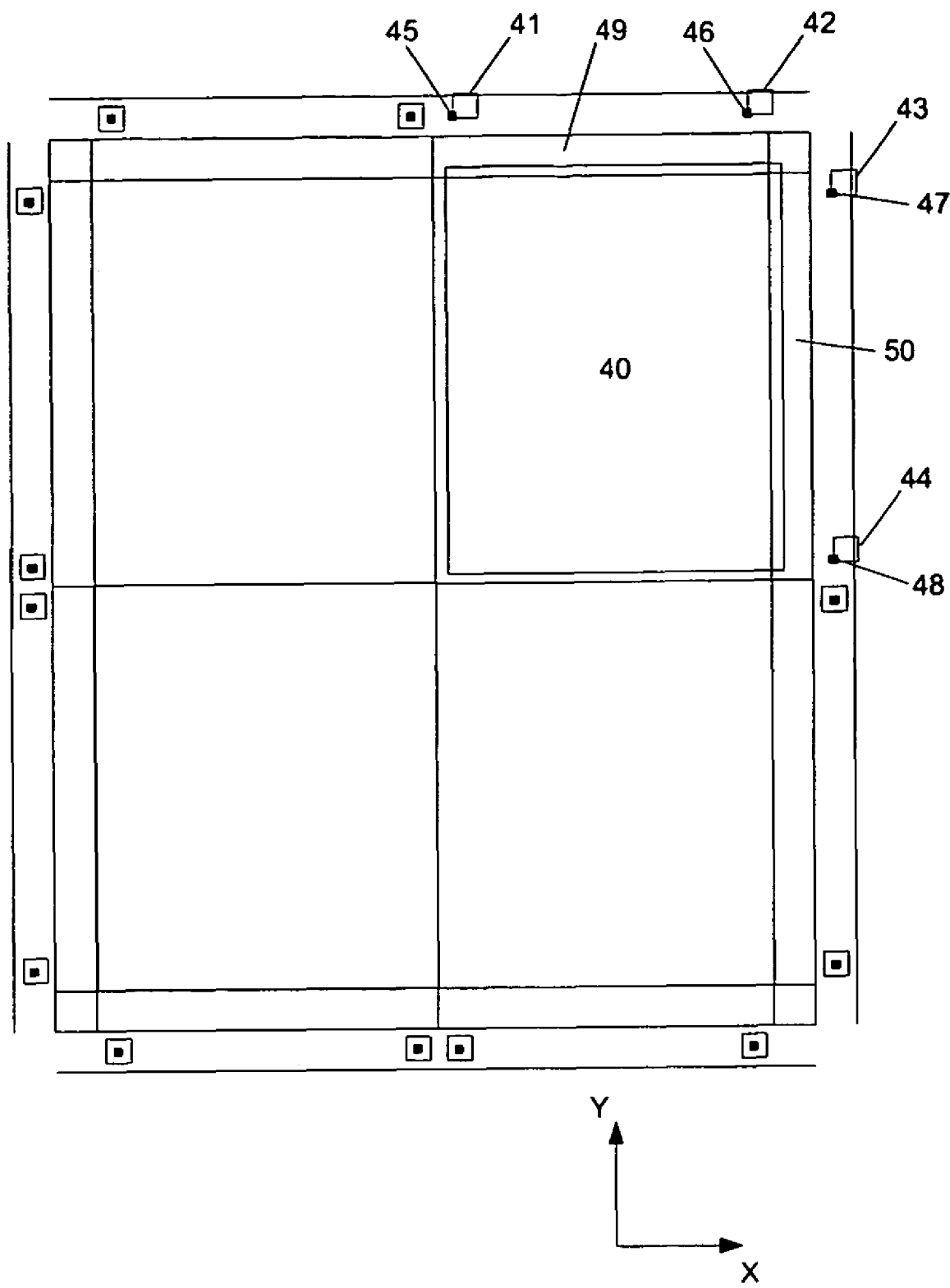
FIG. 4 depicts the composite image of FIG. 2 in the event that one of the image portions is translated from its correct position.

Referring now to FIG. 4, this schematically illustrates an alignment error in which one pixel block 40 is misaligned. Pixel block 40 has been translated along both the X and Y axes, such that it now overlaps the adjacent periphery blocks. Large box metrology marks 41-44 have similarly been moved out of alignment from their correct positions, as they are projected simultaneously with the pixel block 40. However, small box metrology marks 45-48 remain in their expected positions, owing to the fact that these are separately projected at the same time as the periphery blocks 49, 50. Consequently, it can be readily detected that an alignment error has occurred because small box metrology marks 45-48 are no longer centrally located within the large box metrology marks 41-44. Furthermore, it can be seen that the offset from each small box 45-48 to the center of each large box 41-44 is the same. Therefore, by analyzing the offset for each pair of metrology marks, the lithographic apparatus is able to determine that the alignment error is a result of pixel block 40 being translated in both the X and Y directions relative to periphery blocks 49,50.

Figure 5:
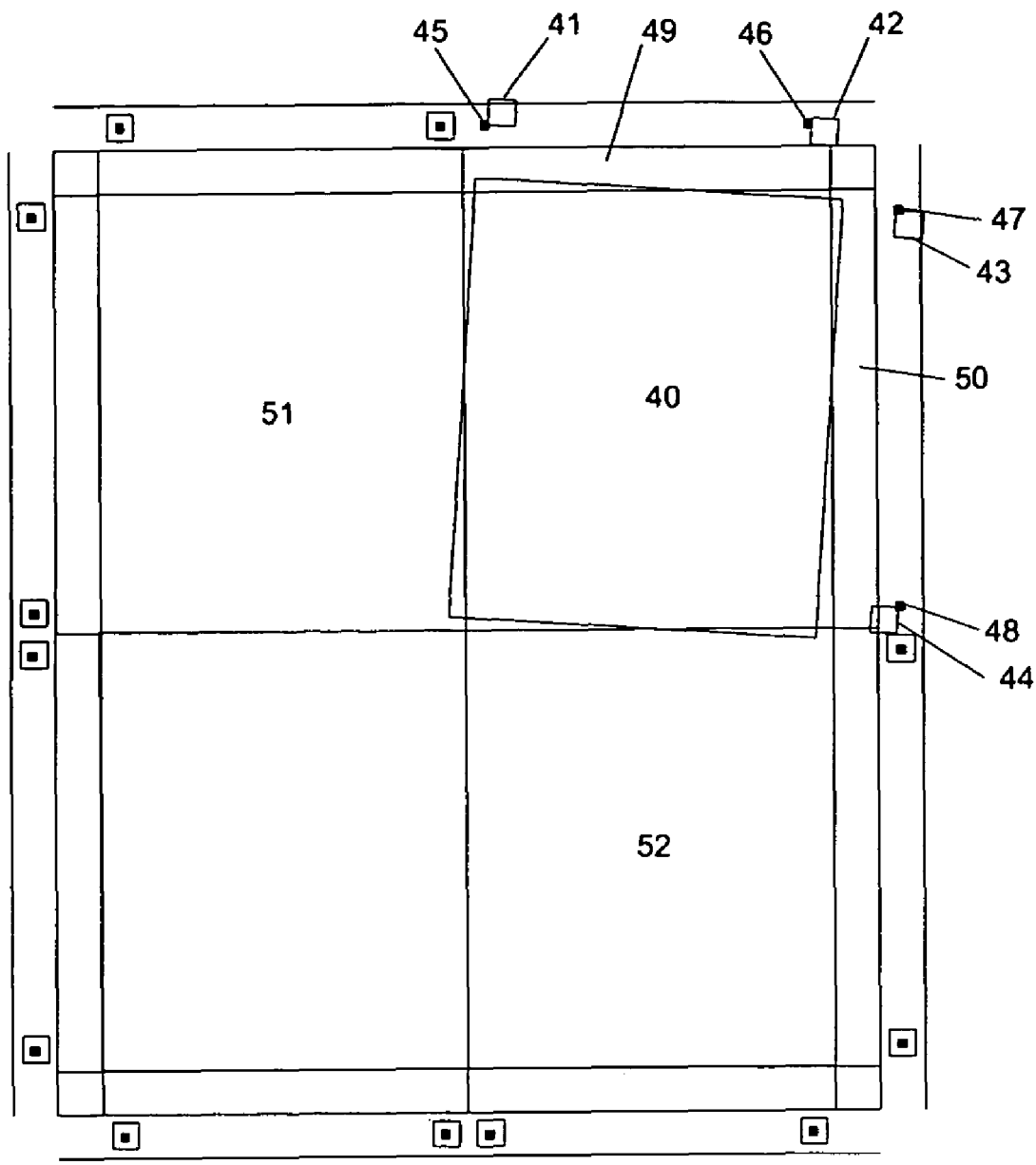
FIG. 5 depicts the composite image of FIG. 2 in the event that one of the image portions is rotated about its correct position.

Referring now to FIG. 5, this schematically illustrates an alignment error in which pixel block 40 has been rotated about its center position, such that it now partly overlaps the adjacent periphery blocks 49,50 and also adjacent pixel blocks 51,52. Large box metrology marks 41-44 have similarly been moved out of alignment from their correct positions by being rotated about the center position of pixel block 40. Again, however, small box metrology marks 45-48 remain in their expected positions. As before, it can be readily detected that an alignment error has occurred because small box metrology marks 45-48 are no longer centrally located within the large box metrology marks 41-44. This time, however, it can be seen that the relative offset from each small box 45-48 to the center of each large box 41-44 is different. Firstly, the large boxes have been rotated, and secondly, each has been translated by a different amount along the X and Y axes. By analyzing the offset for each pair of metrology marks and the rotation of the large box metrology marks 41-44, the lithographic apparatus is able to determine that the alignment error is a result of pixel block 40 being rotated and also determine the degree of rotation and the center of rotation.

Figure 6:
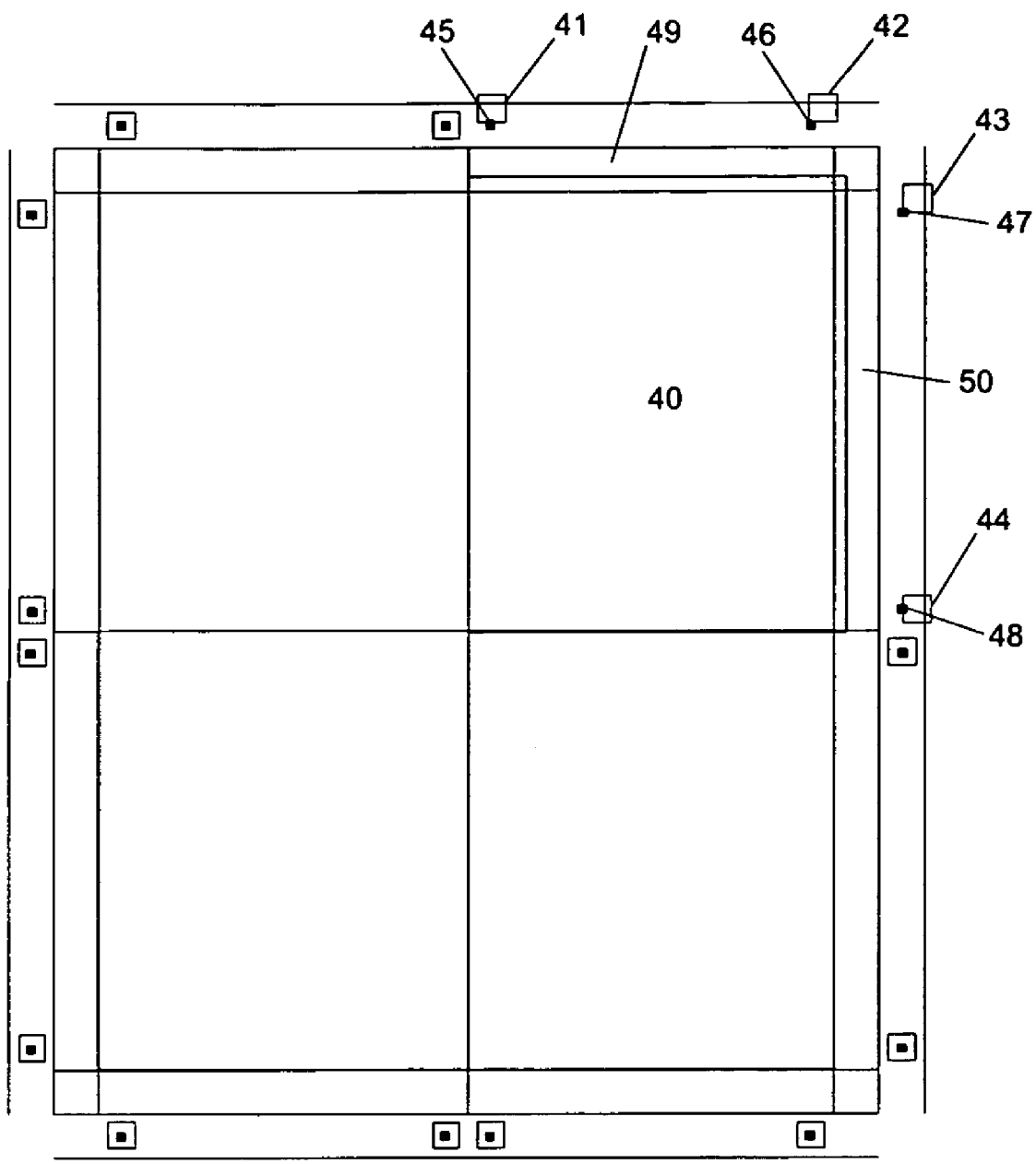
FIG. 6 depicts the composite image of FIG. 2 in the event that one of the image portions is magnified greater than its correct size.

Referring now to FIG. 6, this schematically illustrates an alignment error in which pixel block 40 has been magnified, such that it now partly overlaps the adjacent periphery blocks 49,50. The bottom left corner of pixel block 40 remains in the correct position, and the magnification is along the positive X and Y axes. Large box metrology marks 41-44 have similarly been magnified, however the increase in size is less notably that the fact that they have consequently been translated from their correct positions along the X and Y axes. Again, however, small box metrology marks 45-48 remain in their expected positions. As before, it can be readily detected that an alignment error has occurred because small box metrology marks 45-48 are no longer centrally located within the large box metrology marks 41-44. As for FIG. 5, it can be seen that the relative offset from each small box 45-48 to the center of each large box 41-44 is different. Each large box has been translated by a different amount along the X and Y axes. By analyzing the offset for each pair of metrology marks and the magnification of the large box metrology marks 41-44, the lithographic apparatus is able to determine that the alignment error is a result of pixel block 40 being magnified and also determine the degree of magnification.

FIGS. 4 to 6 schematically illustrate example situations in which all image portions except a single pixel block are correctly aligned. It will be readily appreciated that if more than one image portion were to be misaligned then such alignment errors would be detected by relative offsets between one or more pairs of metrology marks.

If a periphery mark is misaligned, for instance if periphery mark 50 were to be translated in the negative Y direction, then this would be detectable due to small box metrology marks 47,48 being translated in the negative Y direction relative to large box metrology marks 43,44 projected onto the substrate at the same time as pixel block 40. It will be appreciated that it is unlikely that adjacent image portions, for instance pixel block 40 and periphery block 50 would be misaligned by the same amount, such that metrology marks 43,44,47,48 maintain the correct relative spatial relationship. This is because pixel block 40 and periphery block 50 are separately projected onto the substrate by the lithographic apparatus. However, even if two adjacent image portions were misaligned by the same amount, it is likely that the misalignment of one or other of the pair of image portions would be detectable by that image portion's misalignment relative to another adjacent image portions.

It will be appreciated that the examples depicted in the Figures are merely exemplary, and other arrangements are possible. For instance, pairs of metrology marks associated with a periphery block could be more widely spaced such that they overlap and cooperate with the metrology marks projected into the scribe lane associated with an adjacent periphery block. The scope of the present invention covers any and all arrangements of metrology marks projected onto a substrate outside of the image area of a composite image.

Embodiments of the present invention as described above are adapted to detect alignment errors for image portions forming part of a composite image. It has been described how the lithographic apparatus can detect the type of alignment error, and detect which image portions are misaligned by comparing the relative offsets of pairs of metrology marks. In certain embodiments of the present invention the lithographic apparatus is further adapted to use the measurements of image portion alignment errors not only for detecting if unacceptably large alignment errors have occurred, but also in order to calibrate the lithographic apparatus, for instance adjusting the patterning device alignment system, the substrate table alignment system and/or the projection system in order to reduce further errors. This has the benefit of increasing the overall alignment accuracy for devices fabricated using the alignment system and also reducing the number of devices that have to be thrown away due to unacceptably large alignment errors. This is because some alignment errors may be due to gradual movement of component parts of the lithographic apparatus over time that may not immediately cause unacceptable alignment errors, but may build up over time until they do cause unacceptable errors. Such an alignment error measurement and calibration system may be implemented in software in a computer associated with the lithographic apparatus.

Referring now to FIG. 7, this schematically illustrates a composite image 60 built up from a number of image portions in accordance with a further embodiment of the present invention. Composite image 60 is similar to composite image 1 illustrated in FIG. 2, however there is now an array of nine pixel blocks 2 surrounded by periphery blocks 3. The image portions 2,3 remain surrounded by the scribe lanes 4, in which metrology marks 5,6 are imaged. However, unlike the embodiment of the present invention depicted in FIG. 2 there is now one pixel block 2, for convenience also referred to as block 61, that is not adjacent to a periphery block 3. Consequently, it is cumbersome to project large box metrology marks into the scribe lanes 4 at the same time as projecting pixel block 61 onto the substrate, as the combined area of the patterned projection beam required would generally exceed the maximum cross section of the patterned projection beam. It will be appreciated that the array of pixel blocks 2 may be larger, such that there may be more pixel blocks not adjacent to a periphery block. It may not be possible to directly measure the alignment accuracy of pixel block 61 relative to the adjacent pixel blocks 2. However, it remains possible to directly measure the alignment accuracy of all of the other image portions 2,3. As discussed above, in embodiments of the present invention in which the lithographic apparatus is adapted to extract the measurements of the alignment of image portions. In accordance with an embodiment of the present invention, the lithographic apparatus is further adapted to determine the average alignment performance in projecting the image portions other than pixel block 61. If the average alignment performance is within an acceptable band, then the probability that pixel block 61 is also correctly aligned can be calculated. In this manner, a threshold probability that pixel block 61 is correctly aligned can be set and if the calculated probability exceeds the threshold, then pixel block 61 is assumed to be aligned correctly. Processing of the further layers of the device can continue. If the calculated probability does not exceed the threshold, then pixel block is assumed to be incorrectly aligned. The device can then be thrown away without the expense of processing all of the remaining layers of the device or reworked after alignment corrections have been applied.

In addition to determining whether or not the pixel block 61 has been correctly aligned, the embodiment of the invention may also include adjusting the lithographic apparatus to improve the alignment of the pixel block 61 before it is projected onto the substrate. For example, if it is determined that other pixel blocks are all slightly displaced in the same direction, relative to their expected positions, the lithographic apparatus may apply the same displacement to the pixel block 61 (by moving the substrate table in an appropriate direction). Similarly, if the lithographic apparatus determines that an adjustment of the projection system would improve alignment of the pixel block 61 (e.g. an adjustment of the magnification), then this adjustment may be made prior to projecting the pixel block onto the substrate.

The above described embodiments of the present invention are primarily described as comprising box-in-box metrology marks in order to measure the alignment of image portions comprising a composite image. However, it will be appreciated that the present invention extends to any kind of known metrology marks, when projected onto a substrate outside of the area of a composite image. Such alternate type of metrology marks could include diffraction gratings, for which interference patterns formed from light reflected from the diffraction gratings can be measured in order to determine the alignment of the metrology marks, and thus the alignment of the associated image portions. Furthermore, within a single embodiment of the present invention, more than one different type of metrology mark may be used. The term 'metrology mark' is not intended to restrict the mark to any particular type, or to imply any undue restriction on the manner in which the mark may be used.

The measurement of the alignment of the metrology marks may take place within the lithographic apparatus itself, while the substrate is still in position. This could use standard metrology apparatus forming part of the lithographic apparatus, conventionally used to measure the positions of the substrate and/or the patterning device. Alternatively, the measurement could take place outside of the lithographic apparatus, for instance during other processing steps applied to the substrate after the substrate has been patterned for a single layer.

The above described embodiments of the present invention are directed to a lithographic apparatus and method for forming metrology marks outside the area of a composite image, such that the alignment of image portions forming a composite image at a single layer of a device can be measured. However, it will be appreciated that the same technique can be used to measure the alignment accuracy when further layers are projected over the top of the first layer. For instance, when part of a first layer is projected, a first metrology mark, for instance a large box may be projected within a scribe line outside of the composite image. When part of a second layer is projected over the same part of the first layer a second metrology mark, for instance a small box, may be projected, such that the alignment of the metrology marks projected as part of two different layers can be measured, thus providing a measurement of the overlay accuracy of the two layers.

In embodiments of the present invention described above the pixel block patterning portion 16, periphery block patterning portions 17-20 and the metrology mark patterning portions 21 and 22 are described as being located on a single patterning device, such as a single mask. However, in alternative embodiments of the present invention each image portion patterning portion 16-20 may be located on a separate patterning device, such as separate masks. Each separate mask corresponds to a separate mask region 11-15 shown in FIG. 3 for a single mask. Each separate mask would also include the associated metrology marks 21,22 shown in mask regions 11-15, such that even if separate masks are used for each image portion, each image portion when projected onto the substrate is still in a fixed spatial relationship with its associated metrology marks.

Referring back to FIG. 3, this illustrates a patterning device in accordance with an embodiment of the present invention comprising patterning portions relating to all of the image portions and metrology marks to be projected onto a substrate in order to create a composite projected image. In accordance with an alternative embodiment of the present invention, a mask template is provided which comprises a mask with defined regions 11-15 including the metrology marks 21,22. However the pixel block and periphery block patterning portions 16,17-20 are not defined. Such a template is advantageous in that the mask has predefined metrology marks that ensure that anything within regions 11-15 can be projected onto a substrate in a manner that allows the relative alignment to be checked, while allowing the pixel block and periphery block patterning portions 16,17-20 to be later customized.

A further embodiment of the present invention comprises a reference wafer that can be used to compare the relative positional accuracy of two separate lithographic apparatuses. A first layer is projected onto the surface of a substrate coated with a layer of resist, using a calibrated lithographic apparatus as described above. The pattern projected onto the surface of the substrate comprises at least one patterned portion and at least one offset metrology mark. This first layer is exposed and processed (e.g. including etching) in order to preserve the pattern. The substrate is coated with a further layer of resist and transferred to a different lithographic apparatus. A second layer is then projected onto the substrate, also comprising at least one patterned portion and at least one offset metrology mark. The offset of the projected image relative to the first layer can be determined by measuring the relative offset of the two metrology marks. The second layer pattern can be removed by removing the layer of resist, thus allowing the same reference wafer to be used to calibrate the relative positional accuracy of other lithographic apparatuses. In this way, a number of lithographic apparatuses can be calibrated such that their positional accuracy is determined relative to a single reference lithographic apparatus (that is, the lithographic apparatus used to project the first layer onto the substrate).

Having described specific embodiments of the present invention, it will be understood that many modifications thereof will readily be apparent to those skilled in the art, and it is intended therefore that this invention is limited only by the spirit and scope of the following claims.

What is claimed is:

1. A lithographic method comprising:
   patterning a beam of radiation with a patterning device, the patterning device comprising two image patterning portions and two metrology mark patterning portions;
   projecting at least two image portions of the patterned beam of radiation sequentially onto target portions of a substrate such that said projected image portions are substantially adjacent to each other on the substrate and collectively form a composite image on the substrate;
   projecting a metrology mark onto the substrate outside of the area of the composite image at the same time as projecting each of at least two of the image portions; and
   measuring the alignment of said metrology marks to determine the relative positions of the at least two image portions.

2. A lithographic method according to claim 1, wherein said projecting the metrology marks comprises projecting the metrology marks onto scribe lanes located on the substrate outside of the area of the composite image.

3. A lithographic method according to claim 1, wherein said measuring the alignment of said metrology marks comprises measuring a relative offset of the metrology marks.

4. A lithographic method according to claim 2, wherein said projecting the metrology marks comprises:
   projecting a first metrology mark comprising an outline of a first shape onto the surface of the substrate; and
   projecting a second metrology mark within the outline of the first shape, such that measuring the alignment of the metrology marks comprises measuring the offset of the second metrology mark from the center of the first metrology mark.

5. A lithographic method according to claim 1, wherein at least one of the metrology marks comprises diffraction gratings, and wherein said measuring the alignment of said metrology marks further comprises measuring interference between light reflected from the metrology marks.

6. A lithographic method according to claim 1, wherein the image portions are arranged to be substantially adjacent to each other on the substrate along a first axis.

7. A lithographic method according to claim 6, wherein the image portions are further arranged to be substantially adjacent to each other on the substrate along a second axis that is different from the first axis.

8. A lithographic method according to claim 1, wherein the image portions comprise image blocks and periphery blocks, and wherein the composite image comprises two or more image blocks surrounded by periphery blocks.

9. A lithographic method according to claim 8, further comprising screening off portions of the beam of radiation with a blading system such that projecting each image portion onto the substrate comprises projecting only those parts of the patterned projection beam relating to selected patterned portions onto the surface of the substrate.

10. A lithographic method according to claim 8, wherein each metrology mark patterning portion is in a fixed spatial relationship with a respective image block patterning portion or a respective periphery block patterning portion.

11. A lithographic method according to claim 8, wherein the composite image comprises a plurality of image blocks such that at least one image block is not adjacent to a periphery block.

12. A lithographic method according to claim 11, further comprising:
   determining the relative positions of at least two of the image portions other than the at least one image block not adjacent to a periphery block; and
   determining the probable position of the at least one image block not adjacent to a periphery block relative to at least one other image portion from said determined relative positions.

13. A lithographic method according to claim 1, further comprising calibrating the support structure for supporting the patterning device, the substrate table for holding the substrate and/or the projection system using the determined alignment of the image portions.

14. A lithographic method comprising:
   patterning a beam of radiation with a patterning device;
   projecting a plurality of image portions sequentially onto target portions of a substrate such that said projected image portions are substantially adjacent to each other on the substrate and collectively form a composite image on the substrate, the composite image comprising at least one image portion completely surrounded by other image portions;
   determining the relative positions of at least two of the image portions, other than the image portion completely surrounded by other image portions; and
   determining the probable position of the at least one image portion completely surrounded by other image portions, relative to at least one other image portion, from the determined relative positions.

15. A lithographic method according to claim 14, further comprising adjusting the position of the substrate and/or adjusting a projection system used to project the patterned beam of radiation, to at least partially correct for a determined deviation of the position or shape of the surrounded image portion from an expected position or shape.

* * * * *